United States Patent
Won et al.

(10) Patent No.: US 10,553,656 B2
(45) Date of Patent: Feb. 4, 2020

(54) DISPLAY APPARATUS

(71) Applicant: LG Display Co., Ltd., Seoul (KR)

(72) Inventors: Sanghyuk Won, Gimpo-si (KR); SangHoon Pak, Seoul (KR); Jaehyung Jang, Paju-si (KR); Yuna Lee, Suwon-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 16/022,196

(22) Filed: Jun. 28, 2018

(65) Prior Publication Data

US 2019/0006431 A1    Jan. 3, 2019

(30) Foreign Application Priority Data

Jun. 30, 2017   (KR) .......................... 10-2017-0083743

(51) Int. Cl.
| | |
|---|---|
| *H01L 27/32* | (2006.01) |
| *H01L 51/52* | (2006.01) |
| *G06F 3/044* | (2006.01) |
| G09G 3/3266 | (2016.01) |
| G06F 3/041 | (2006.01) |
| G09G 3/3275 | (2016.01) |

(52) U.S. Cl.
CPC ............ *H01L 27/323* (2013.01); *G06F 3/044* (2013.01); *H01L 27/3223* (2013.01); *H01L 51/5253* (2013.01); *G06F 3/0416* (2013.01); *G06F 2203/04111* (2013.01); *G09G 3/3266* (2013.01); *G09G 3/3275* (2013.01); *G09G 2310/08* (2013.01); *H01L 27/3276* (2013.01); *H01L 2251/5392* (2013.01)

(58) Field of Classification Search
None
See application file for complete search history.

(56) References Cited

U.S. PATENT DOCUMENTS

2016/0132148 A1    5/2016   Han et al.
2017/0365814 A1*  12/2017   Kim .................... H01L 51/5246

FOREIGN PATENT DOCUMENTS

| CN | 104425760 A | 3/2015 |
| CN | 107527551 A | 12/2017 |

* cited by examiner

*Primary Examiner* — Anthony Ho
*Assistant Examiner* — Kevin Quinto
(74) *Attorney, Agent, or Firm* — Seed Intellectual Property Law Group LLP

(57) ABSTRACT

Disclosed is a display apparatus for preventing a short circuit defect from being caused by a residual metal layer. The display apparatus includes a first substrate including a display area where a plurality of pixels are provided and a non-display area surrounding the display area, a dam disposed in the non-display area to surround the display area, an encapsulation film disposed on the first substrate to cover the display area and to contact the dam, and a metal pattern disposed on the encapsulation film. The dam includes a first dam, a second dam disposed in an outer portion of the first dam, and a third dam connecting the first dam to the second dam.

14 Claims, 6 Drawing Sheets

DISPLAY APPARATUS

CROSS-REFERENCE TO RELATED APPLICATION

This application claims the benefit of the Korean Patent Application No. 10-2017-0083743 filed on Jun. 30, 2017, which is hereby incorporated by reference as if fully set forth herein.

BACKGROUND

Technical Field

The present disclosure relates to a display apparatus.

Description of the Related Art

With the advancement of information-oriented society, various requirements for display apparatuses for displaying an image are increasing. Therefore, various display apparatuses such as liquid crystal display (LCD) apparatuses, plasma display panel (PDP) apparatuses, and organic light emitting display apparatuses are being used recently.

As a type of display apparatus, organic light emitting display apparatuses are self-emitting display apparatuses and are better in viewing angle and contrast ratio than LCD apparatuses. Also, since the organic light emitting display apparatuses do not need a separate backlight, it is possible to lighten and thin the organic light emitting display apparatuses, and the organic light emitting display apparatuses are excellent in power consumption. Furthermore, the organic light emitting display apparatuses are driven with a low direct current (DC) voltage, have a fast response time, and are low in manufacturing cost.

However, in the organic light emitting display apparatuses, each of a plurality of pixels includes an organic light emitting device, and the organic light emitting device is easily deteriorated by external factors such as external water and oxygen. In order to prevent the deterioration, the organic light emitting display apparatuses include an encapsulation film for preventing external water or oxygen from penetrating into the organic light emitting device.

The encapsulation film includes at least one inorganic layer and at least one organic layer, and thus, prevents oxygen or water from penetrating into an organic light emitting layer and an electrode. The at least one organic layer is generally formed of a polymer. In this case, the polymer is coated on a substrate in a liquid state, and then, by performing a curing process on the coated polymer, the at least one organic layer is formed. Since the organic layer has flowability until before the curing process, the organic layer can flow into an area (for example, a pad area where a plurality of pads are provided) where the encapsulation film is to be formed. In order to solve such a problem, a dam for blocking the flow of the organic layer is provided along an outer portion of the organic light emitting device recently.

The dam is provided in plurality for effectively preventing the organic layer from flowing out, and in this case, a surface of an organic light emitting display apparatus is not flat due to a step height caused by the dam. For this reason, if a layer is deposited on the dam, the following problems occur.

First, if metal patterns are formed on the dam through a process using a photoresist pattern, metal in a region which should be removed is not normally removed and remains as a residual layer.

Particularly, since an interval between the plurality of dams is narrow, a residual metal layer can remain between a first pad and a second pad adjacent thereto in the pad area even in a case of performing an over-etching process. If the residual metal layer remains between the first pad and the second pad, a current flows between the first pad and the second pad due to the residual metal layer, causing a short circuit defect.

BRIEF SUMMARY

Accordingly, the present disclosure is directed to provide a display apparatus that substantially obviates one or more problems due to limitations and disadvantages of the related art.

In one or more embodiments, the present disclosure provides a display apparatus for preventing a short circuit defect from being caused by a residual metal layer.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, in one embodiment, the present disclosure provides a display apparatus including a first substrate including a display area where a plurality of pixels are provided and a non-display area surrounding the display area, a dam disposed in the non-display area to surround the display area, an encapsulation film disposed on the first substrate to cover the display area and to contact the dam, and a metal pattern disposed on the encapsulation film, wherein the dam includes a first dam, a second dam disposed in an outer portion of the first dam, and a third dam connecting the first dam to the second dam.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
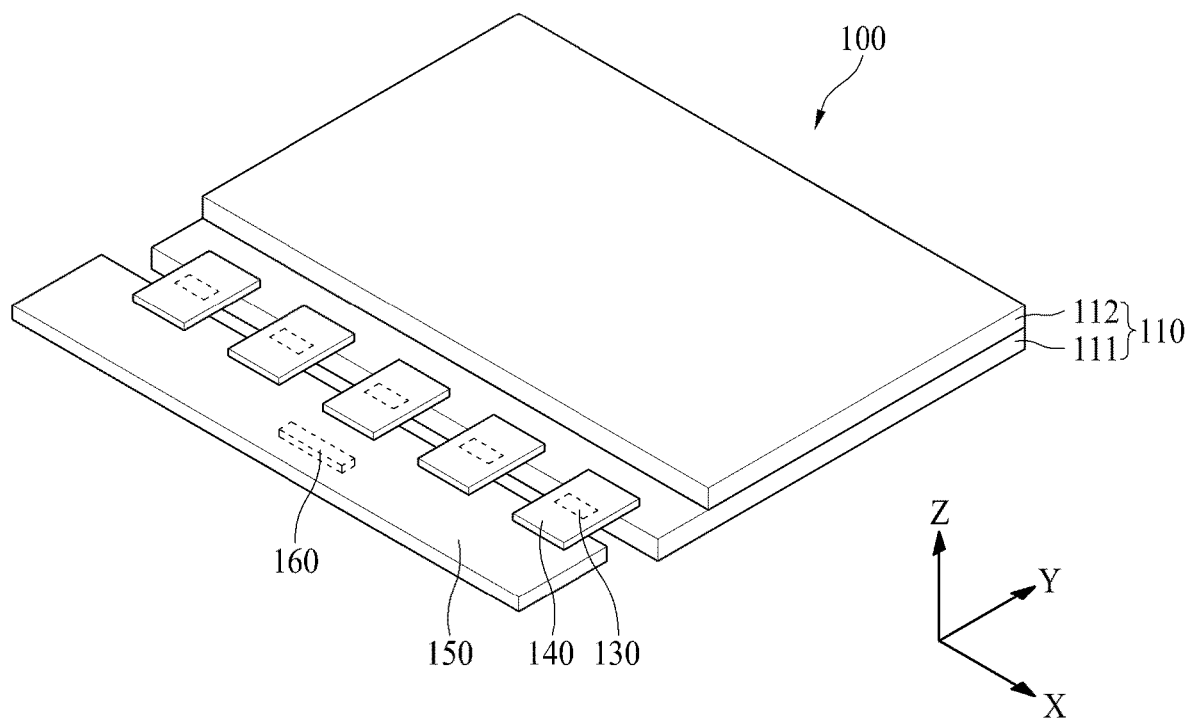
FIG. 1 is a perspective view illustrating a display apparatus according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

The terms described in the specification should be understood as follows.

The terms described in the specification should be understood as follows. As used herein, the singular forms "a," "an" and "the" are intended to include the plural forms as well, unless the context clearly indicates otherwise. The terms "first" and "second" are for differentiating one element from the other element, and these elements should not be limited by these terms. It will be further understood that the terms "comprises," "comprising," "has," "having," "includes" and/or "including," when used herein, specify the presence of stated features, integers, steps, operations, elements, and/or components, but do not preclude the presence or addition of one or more other features, integers, steps, operations, elements, components, and/or groups thereof. The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item. The term "on" should be construed as including a case where one element is formed at a top of another element and moreover a case where a third element is disposed therebetween.

Hereinafter, exemplary embodiments of a display apparatus according to the present disclosure will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present disclosure, the detailed description will be omitted.

Hereinafter, exemplary embodiments of the present disclosure will be described in detail with reference to the accompanying drawings.

Figure 2:
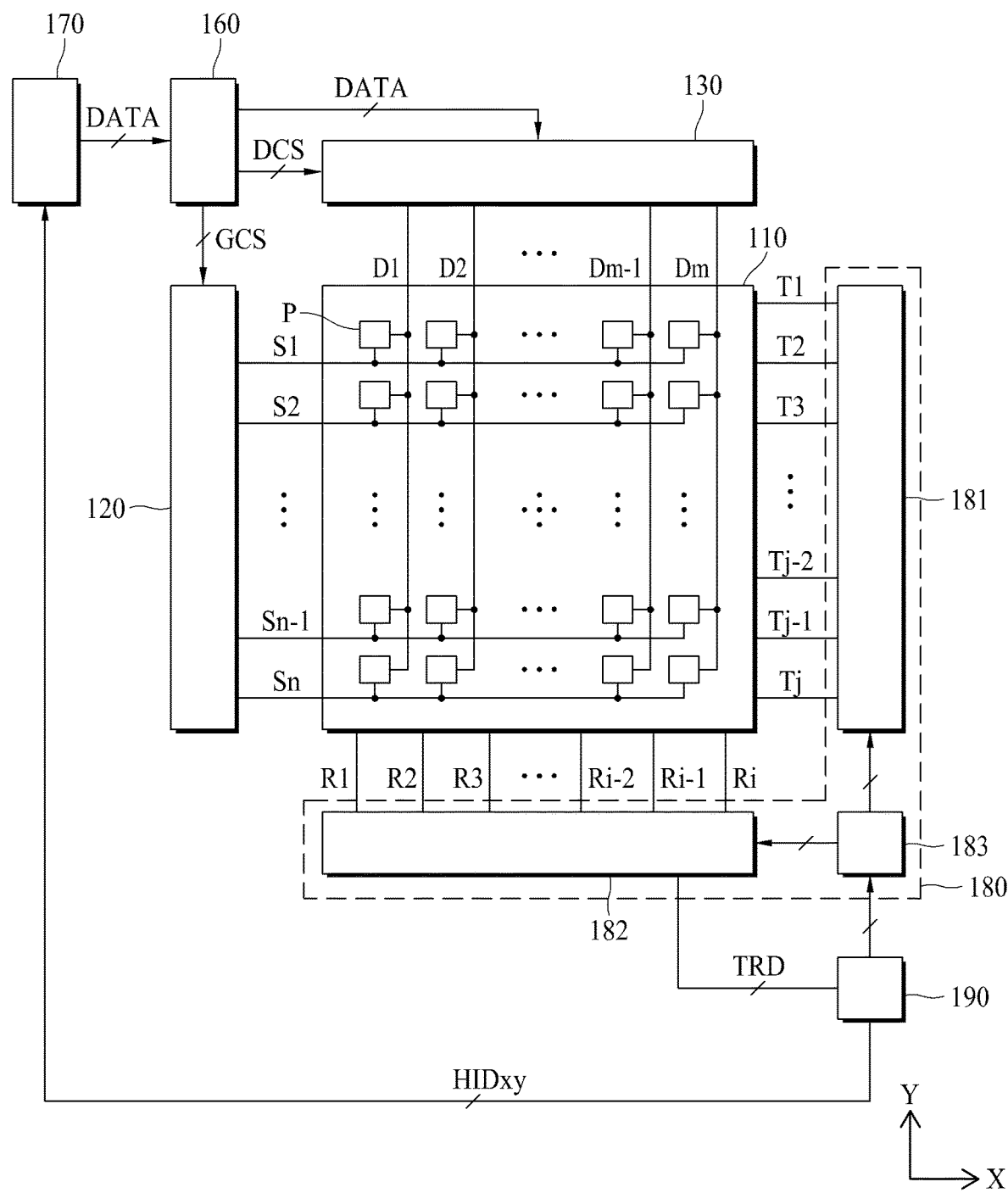
FIG. 2 is a block diagram illustrating a display apparatus according to an embodiment of the present disclosure.

FIG. 1 is a perspective view illustrating a display apparatus according to an embodiment of the present disclosure, and FIG. 2 is a block diagram illustrating the display apparatus according to an embodiment of the present disclosure.

Referring to FIGS. 1 and 2, the display apparatus 100 according to an embodiment of the present disclosure may include a display panel 110, a scan driver 120, a data driver 130, a timing controller 160, a host system 170, a touch driver 180, and a touch coordinate calculator 190.

The display apparatus according to an embodiment of the present disclosure may be implemented as a flat panel display apparatus such as an LCD apparatus, a field emission display (FED) apparatus, a PDP apparatus, an organic light emitting display apparatus, an electrophoresis display (EPD) apparatus, or the like. Hereinafter, an example where the display apparatus according to an embodiment of the present disclosure is implemented as an organic light emitting display apparatus will be described, but the present disclosure is not limited thereto.

The display panel 110 may include a display area where a plurality of pixels P are provided to display an image. A plurality of data lines D1 to Dm (where m is a positive integer equal to or more than two) and a plurality of scan lines S1 to Sn (where n is a positive integer equal to or more than two) may be provided. The data lines D1 to Dm may be disposed to intersect the scan lines S1 to Sn. The term "intersect" is used herein to mean that one element crosses over or overlaps another element, and does not necessarily mean that the two elements contact each other. For example, the data lines D1 to Dm and the scan lines S1 to Sn may intersect each other, but may be physically separated from one another, for example, by one or more layers or elements provided therebetween. The pixels P may be respectively provided in a plurality of areas defined by an intersection structure of the data lines D1 to Dm and the scan lines S1 to Sn.

Each of the pixels P of the display panel 110 may be connected to one of the data lines D1 to Dm and one of the scan lines S1 to Sn. Each of the pixels P of the display panel 110 may include a driving transistor which controls a drain-source current according to a data voltage applied to a gate electrode, a scan transistor which is turned on by a scan signal of a scan line and supplies the data voltage of a data line to the gate electrode of the driving transistor, an organic light emitting diode (OLED) which emits light with the drain-source current of the driving transistor, and a capacitor which stores a voltage at the gate electrode of the driving transistor. Therefore, each of the pixels P may emit light with a current supplied to the OLED.

The scan driver 120 may receive a scan control signal GCS from the timing controller 160. The scan driver 120 may supply scan signals to the scan lines S1 to Sn according to the scan control signal GCS.

The scan driver 120 may be provided in a non-display area outside one side or both sides of a display area of the display panel 110 in a gate driver-in panel (GIP) type. Alternatively, the scan driver 120 may be manufactured as a driving chip and may be mounted on a flexible film, and moreover, may be attached on the non-display area outside the one side or the both sides of the display area of the display panel 110 in a tape automated bonding (TAB) type.

The data driver 130 may receive digital video data DATA and a data control signal DCS from the timing controller 160. The data driver 130 may convert the digital video data DATA into analog positive/negative data voltages according to the data control signal DATA and may supply the data voltages to the data lines. That is, pixels to which the data voltages are to be supplied may be selected by the scan signals of the scan driver 120, and the data voltages may be supplied to the selected pixels.

The data driver 130 may include a plurality of source drive integrated circuits (ICs). Each of the plurality of source drive ICs may be mounted on a flexible film 140 in a chip-on film (COP) type or a chip-on plastic (COP) type. The flexible film 140 may be attached on a plurality of pads provided in the non-display area of the display panel 110 by using an anisotropic conductive film, and thus, the plurality of source drive ICs may be connected to the pads.

The flexible film 140 may be provided in plurality, and a circuit board 150 may be attached on the flexible films 140. A plurality of circuits respectively implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data DATA and timing signals from the host system 170. The timing signals may include a vertical synchronization signal, a horizontal synchronization signal, a data enable signal, a dot clock, etc. The vertical synchronization signal may be a signal that defines one frame period. The horizontal synchronization signal may be a signal that defines one horizontal period necessary for supplying data voltages to pixels of one horizontal line of the display panel 110. The data enable signal may be a signal that defines a period where valid data is input. The dot clock may be a signal that is repeated at a certain short period.

The timing controller 160 may generate the data control signal DCS for controlling an operation timing of the data driver 130 and the scan control signal GCS for controlling an operation timing of the scan driver 120 so as to control the operation timing of each of the scan driver 120 and the data driver 130, based on the timing signals. The timing controller 160 may output the scan control signal GCS to the scan driver 120 and may output the digital video data DATA and the data control signal DCS to the data driver 130.

The host system 170 may be implemented as a navigation system, a set-top box, a DVD player, a blue-ray player, a personal computer (PC), a home theater system, a broadcasting receiver, a phone system, or the like. The host system 170 may include a system-on chip (SoC) with a scaler embedded therein and may convert the digital video data DATA of an input image into a format suitable for displaying the image on the display panel 110. The host system 170 may transmit the digital video data DATA and the timing signals to the timing controller 160.

In addition to the data lines DL1 to DLm and the scan lines SL1 to SLn, a plurality of first and second touch electrodes may be provided in the display panel 110. The first touch electrodes may be provided to intersect, e.g., to overlap with, the second touch electrodes. The first touch electrodes may be connected to a first touch driver 181 through a plurality of first touch lines T1 to Tj (where j is a positive integer equal to or more than two). The second touch electrodes may be connected to a second touch driver 182 through a plurality of second touch lines R1 to Ri (where i is a positive integer equal to or more than two). A plurality of touch sensors may be respectively provided in intersection regions of the first touch electrodes and the second electrodes. In an embodiment of the present disclosure, each of the touch sensors may be exemplarily implemented with a mutual capacitor, but is not limited thereto. The first and second touch electrodes will be described below in detail with reference to FIG. 5.

The touch driver 180 may supply a driving pulse to the first touch electrodes through the first touch line T1 to Tj and may sense charging variations of the touch sensors through the second touch lines R1 to Ri. That is, in FIG. 2, it is described that the first touch lines T1 to Tj are Tx lines through which the driving pulse is supplied, and the second touch lines R1 to Ri are Rx lines through which the charging variations of the touch sensors are respectively sensed.

The touch driver 180 may include a first touch driver 181, a second touch driver 182, and a touch controller 183. The first touch driver 181, the second touch driver 182, and the touch controller 183 may be integrated into one readout integrated chip (ROIC).

The first touch driver 181 may select a first touch line through which the driving pulse is to be output, based on control by the touch controller 183 and may supply the driving pulse to the selected first touch line. For example, the driving pulse may be provided in plurality, and the first touch driver 181 may sequentially supply the driving pulses to the first touch lines T1 to Tj.

The second touch driver 182 may select second touch lines through which charging variations of touch sensors are to be received, based on control by the touch controller 183 and may receive the charging variations of the touch sensors through the selected second touch lines. The second touch driver 182 may sample the charging variations of the touch sensors received through the second touch lines R1 to Ri to convert the charging variations into touch raw data TRD which are digital data.

The touch controller 183 may generate a Tx setup signal for setting a first touch line, to which the driving pulse is to be output from the first touch driver 181, and an Rx setup signal for setting a second touch line through which a touch sensor voltage is to be received from the second touch driver 182. Also, the touch controller 183 may generate timing control signals for controlling the operation timings of the first touch driver 181 and the second touch driver 182.

The touch coordinate calculator 190 may receive the touch raw data TRD from the touch driver 180. The touch coordinate calculator 190 may calculate touch coordinates, based on a touch coordinate calculation method and may output touch coordinate data HIDxy, including information about the touch coordinates, to the host system 170.

The touch coordinate calculator 190 may be implemented with a micro controller unit (MCU). The host system 170 may analyze the touch coordinate data HIDxy input from the touch coordinate calculator 190 to execute an application program associated with coordinates where a touch has been performed by a user. The host system 170 may transmit the digital video data DATA and the timing signals to the timing controller 160 according to the executed application program.

The touch driver 180 may be included in the source drive ICs, or may be manufactured as a separate driving chip and mounted on the circuit board 150. Also, the touch coordinate calculator 190 may be manufactured as a separate driving chip and mounted on the circuit board 150.

Figure 3:
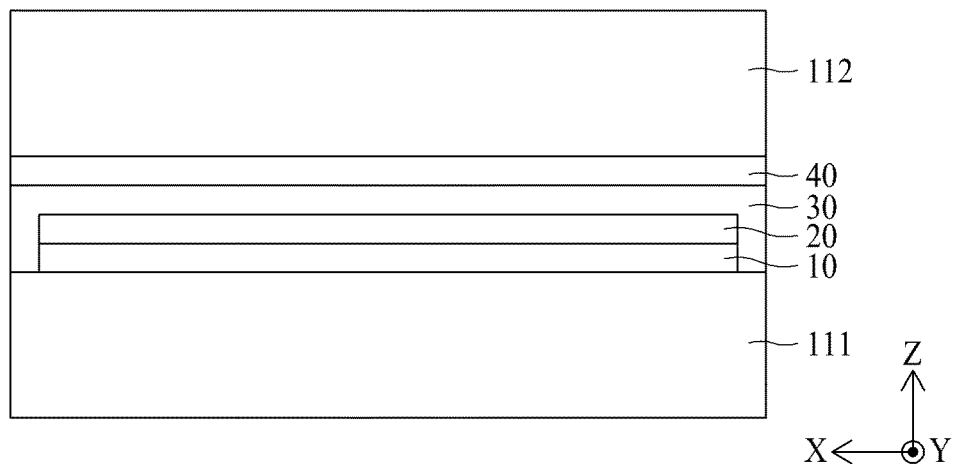
FIG. 3 is a cross-sectional view schematically illustrating one side of a display panel of FIG. 1.

FIG. 3 is a cross-sectional view schematically illustrating one side of the display panel of FIG. 1.

Referring to FIG. 3, the display panel 110 may include a first substrate 111, a second substrate 112, a thin film transistor (TFT) layer 10 disposed between the first and second substrates 111 and 112, an organic light emitting device layer 20, an encapsulation layer 30, and a touch sensing layer 40.

The first substrate 111 may be a plastic film, a glass substrate, or the like.

The TFT layer 10 may be formed on the first substrate 111. The TFT layer 10 may include the scan lines, the data lines, and a plurality of TFTs. The TFTs may each include a gate electrode, a semiconductor layer, a source electrode, and a drain electrode. In a case where the scan driver is provided as the GIP type, the scan driver may be formed along with the TFT layers 10.

The organic light emitting element layer 20 may be formed on the TFT layer 10. The organic light emitting element layer 20 may include a plurality of first electrodes, an organic light emitting layer, a second electrode, and a plurality of banks. The organic light emitting layer may include a hole transporting layer, a light emitting layer, and an electron transporting layer. In this case, when a voltage is applied to the first electrode and the second electrode, a hole and an electron move to the light emitting layer through the hole transporting layer and the electron transporting layer and are combined with each other in the light emitting layer to emit light. Pixels P may be provided in an area where the organic light emitting element layer 20 is provided, and thus, the area where the organic light emitting element layer 20 is provided may be defined as a display area. A peripheral area of the display area may be defined as a non-display area.

The encapsulation layer 30 may be formed on the organic light emitting device layer 20. The encapsulation layer 30 prevents oxygen or water from penetrating into the organic light emitting device layer 20. The encapsulation layer 30 may include at least one inorganic layer.

The touch sensing layer 40 may be formed on the encapsulation layer 30. The touch sensing layer 40 may include a plurality of first and second touch electrodes for sensing a user touch and may include a plurality of bridge electrodes electrically connecting the first touch electrodes or electrically connecting the second touch electrodes.

Hereinafter, the encapsulation layer 30 and the touch sensing layer 40 according to an embodiment of the present disclosure will be described in more detail with reference to FIGS. 4 to 8.

Figure 4:
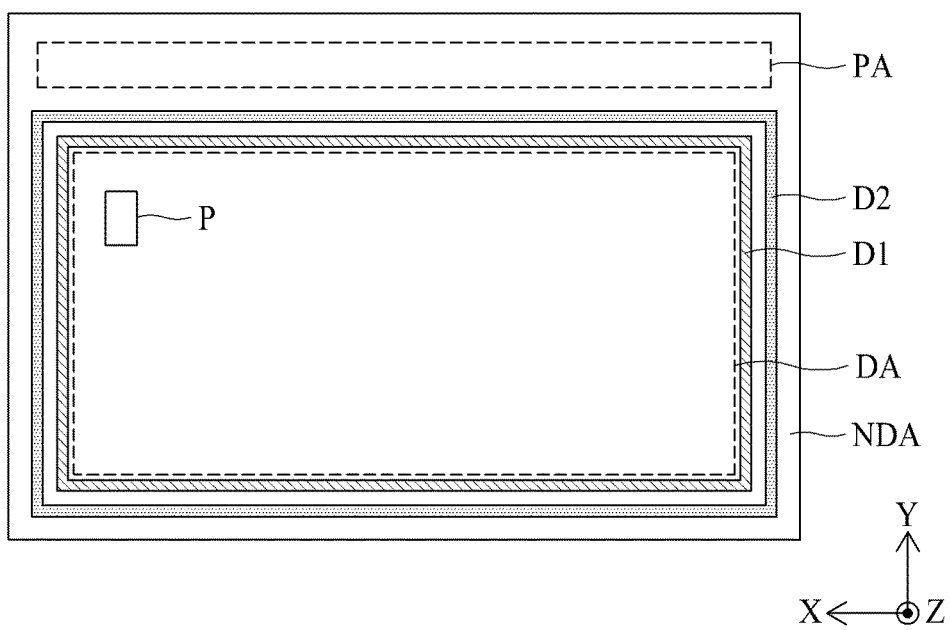
FIG. 4 is a plan view schematically illustrating a first substrate according to an embodiment of the present disclosure.
Figure 5:
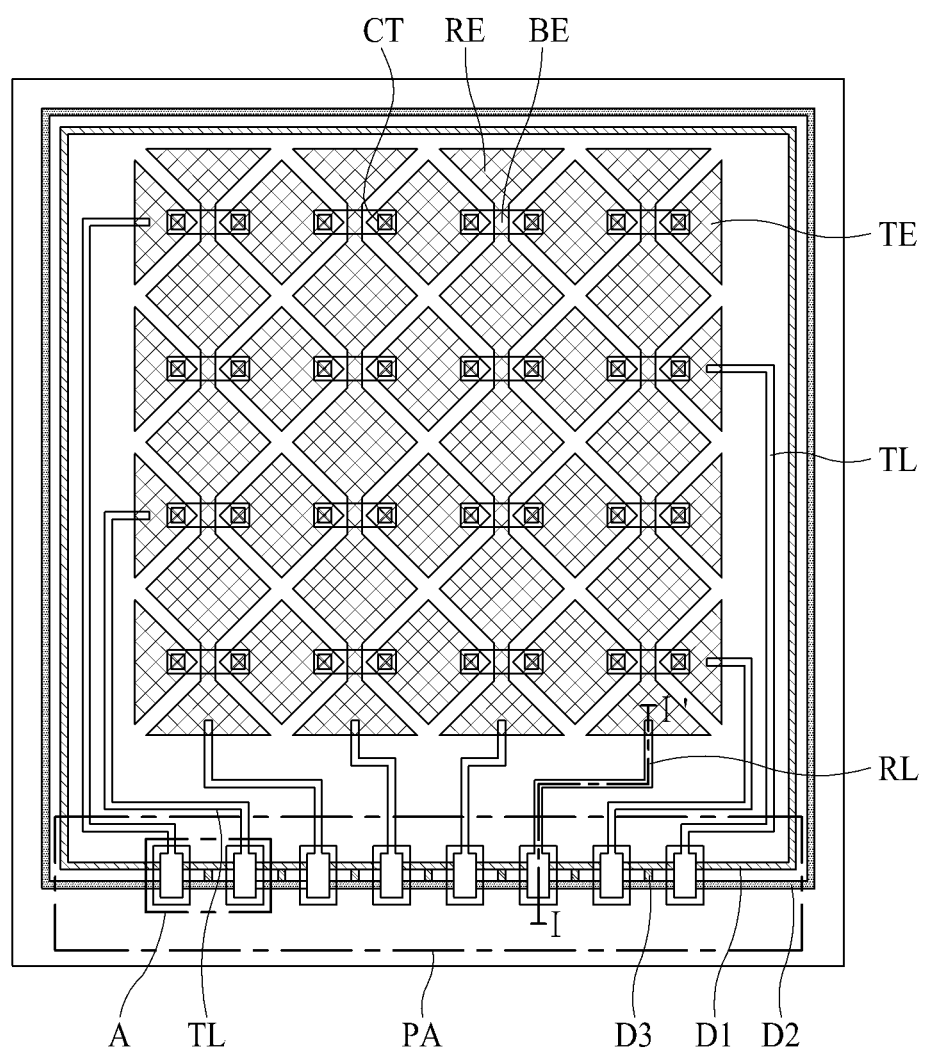
FIG. 5 is a plan view illustrating a touch sensing layer disposed on a first substrate, in accordance with one or more embodiments.
Figure 6:
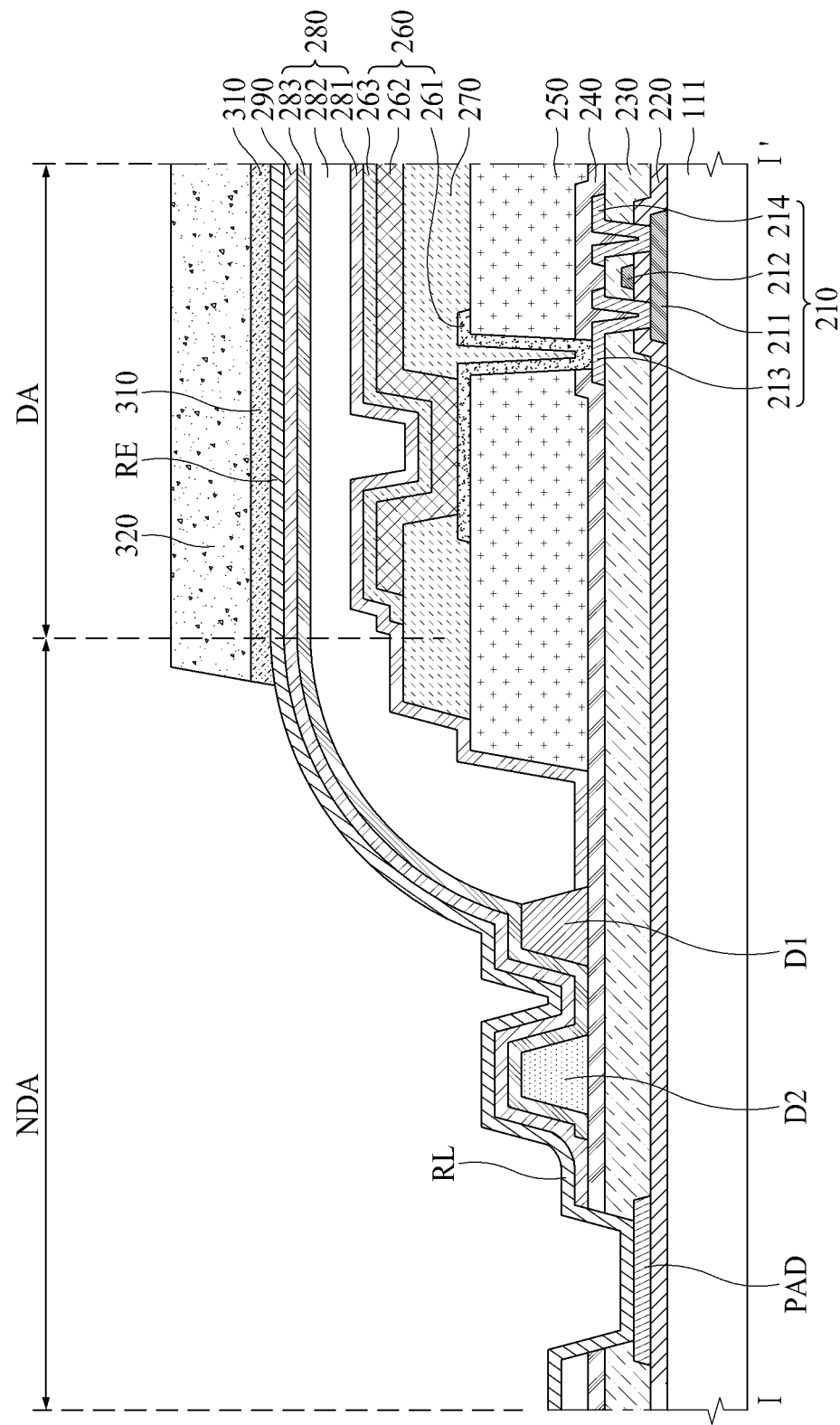
FIG. 6 is a cross-sectional view illustrating an example taken along line I-I' of FIG. 5.
Figure 7:
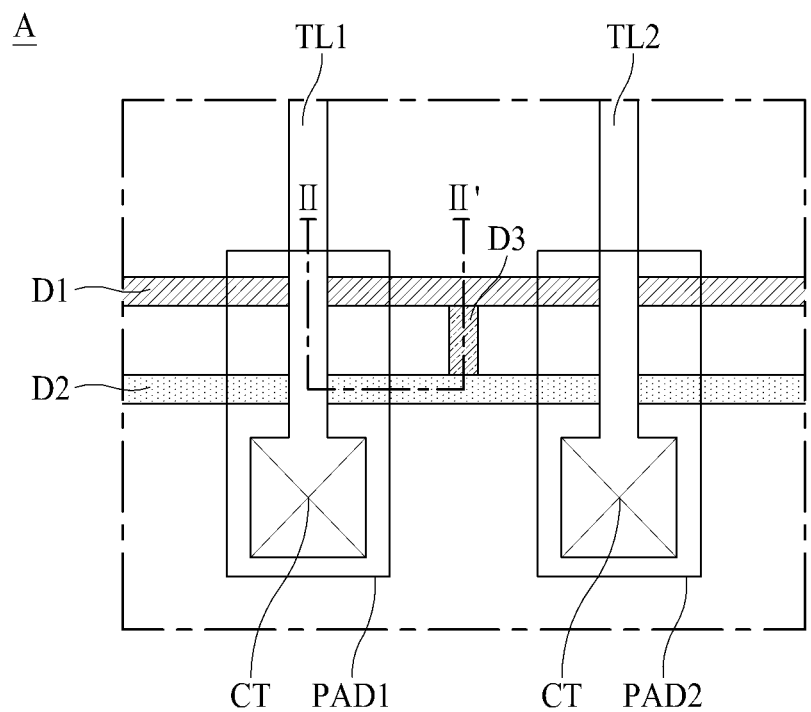
FIG. 7 is an enlarged plan view of a region A of FIG. 5.
Figure 8:
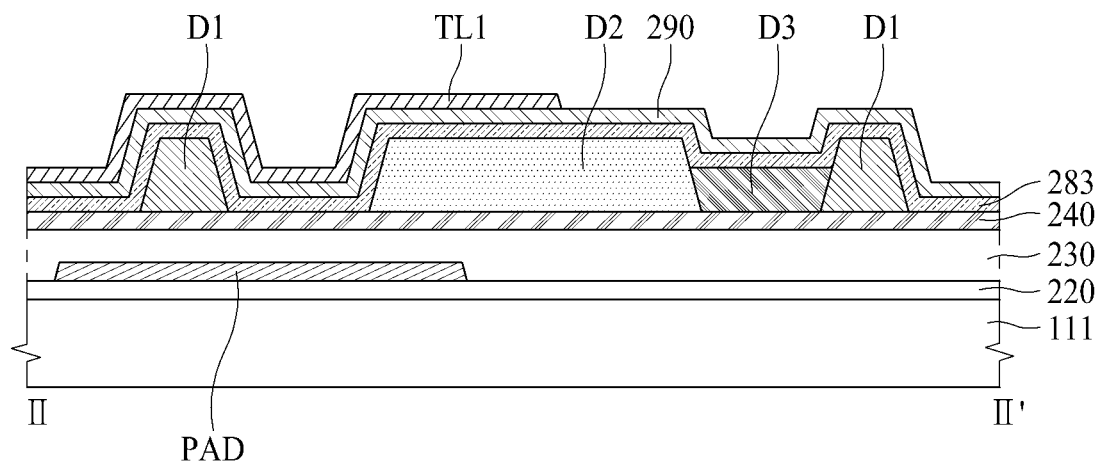
FIG. 8 is a cross-sectional view illustrating an example taken along line II-II' of FIG. 7.

FIG. 4 is a plan view schematically illustrating a first substrate according to an embodiment of the present disclosure, and FIG. 5 is a plan view illustrating a touch sensing layer disposed on the first substrate. FIG. 6 is a cross-sectional view illustrating an example taken along line I-I' of FIG. 5. FIG. 7 is an enlarged plan view of a region A of FIG. 5, and FIG. 8 is a cross-sectional view illustrating an example taken along line II-II' of FIG. 7.

Referring to FIGS. 4 to 8, a first substrate 111 may be divided into a display area DA and a non-display area NDA, and a dam and a pad area PA where a plurality of pads PAD are provided may be provided in the non-display area NDA.

A TFT layer 10 and an organic light emitting element layer 20 may be provided in the display area DA of the first substrate 111.

The TFT layer 10 may include a plurality of TFTs 210, a gate insulation layer 220, an interlayer insulation layer 230, a passivation layer 240, and a planarization layer 250.

A buffer layer may be disposed on one surface of the first substrate 111. The buffer layer may be disposed on the one surface of the first substrate 111, for protecting the TFTs 210 and a plurality of organic light emitting elements 260 from water penetrating through the first substrate 111 vulnerable to penetration of water. The one surface of the first substrate 111 may be a surface facing a second substrate 112. The buffer layer may be formed of a plurality of inorganic layers which are alternately stacked. For example, the first buffer layer may be formed of a multilayer where one or more inorganic layers of silicon oxide (SiOx), silicon nitride (SiNx), and SiON are alternately stacked. The buffer layer may be omitted.

The TFTs 210 may be disposed on the buffer layer. The TFTs 210 may each include an active layer 211, a gate electrode 212, a source electrode 213, and a drain electrode 214. In FIG. 6, the TFTs 210 are exemplarily illustrated as being formed as a top gate type where the gate electrode 212 is disposed on the active layer 211, but is not limited thereto. That is, the TFTs 210 may be formed as a bottom gate type where the gate electrode 212 is disposed under the active layer 211 or a double gate type where the gate electrode 212 is disposed both on and under the active layer 211.

The active layer 211 may be disposed on the first buffer layer. The active layer 211 may be formed of a silicon-based semiconductor material, an oxide-based semiconductor material, and/or the like. A light blocking layer (not shown) for blocking external light incident on the active layer 211 may be disposed between the first buffer layer and the active layer 211.

The gate insulation layer 220 may be disposed on the active layer 211. The gate insulation layer 220 may be formed of an inorganic layer, and for example, may be formed of SiOx, SiNx, or a multilayer thereof.

The gate electrode 212 and a gate line may be disposed on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The interlayer insulation layer 230 may be disposed on the gate electrode 212 and the gate line. The interlayer insulation layer 230 may be formed of an inorganic layer, and for example, may be formed of SiOx, SiNx, or a multilayer thereof.

The source electrode 213, the drain electrode 214, and a data line may be disposed on the interlayer insulation layer 230. Each of the source electrode 213 and the drain electrode 214 may be connected to the active layer 211 through a contact hole which passes through the gate insulation layer 220 and the interlayer insulation layer 230. The source electrode 213, the drain electrode 214, and the data line may each be formed of a single layer or a multilayer which includes one of Mo, Al, Cr, Au, Ti, Ni, Nd, and Cu, or an alloy thereof.

The passivation layer 240 for insulating the TFTs 220 may be disposed on the source electrode 213, the drain electrode 214, and the data line. The passivation layer 240 may be formed of an inorganic layer, and for example, may be formed of SiOx, SiNx, or a multilayer thereof.

The planarization layer 250 for planarizing a step height caused by the TFTs 210 may be disposed on the passivation layer 240. The planarization layer 250 may be formed of an organic layer such as acryl resin, epoxy resin, phenolic resin, polyamide resin, polyimide resin, or the like.

The organic light emitting element layer 20 may be disposed on the TFT layer 10. The organic light emitting element layer 20 may include a plurality of organic light emitting elements 260 and a bank 270.

The organic light emitting elements 260 and the bank 270 may be disposed on the planarization layer 250. The organic light emitting elements 260 may each include a first electrode 261, an organic light emitting layer 262, and a second electrode 263. The first electrode 261 may be an anode electrode, and the second electrode 263 may be a cathode electrode.

The first electrode 261 may be disposed on the planarization layer 250. The first electrode 261 may be connected to the source electrode 213 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be disposed on the planarization layer 250 to cover an edge of the first electrode 261, for dividing the pixels P. That is, the bank 270 may act as a pixel defining layer which defines the pixels P. The bank 270 may be formed of an organic layer such as acryl resin, epoxy resin, phenolic resin, polyamide resin, polyimide resin, or the like.

The organic light emitting layer 262 may be disposed on the first electrode 261 and the bank 270. The organic light emitting layer 262 may include a hole transporting layer, at least one light emitting layer, and an electron transporting layer. In this case, when a voltage is applied to the first electrode 261 and the second electrode 263, a hole and an electron move to the light emitting layer through the hole transporting layer and the electron transporting layer and are combined with each other in the light emitting layer to emit light.

The organic light emitting layer 262 may be a white light emitting layer which emits white light. In this case, the organic light emitting layer 262 may be disposed to cover the first electrode 261 and the bank 270. Also, a color filter (not shown) may be disposed on the second substrate 112.

Alternatively, the organic light emitting layer 262 may be formed as a red light emitting layer emitting red light, a green light emitting layer emitting green light, or a blue light emitting layer emitting blue light. In this case, the organic light emitting layer 262 may be disposed in an area corresponding to the first electrode 261, and the color filter may not be disposed on the second substrate 112.

The second electrode 263 may be disposed on the organic light emitting layer 262. If an organic light emitting display apparatus is implemented in a top emission structure, the second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. A capping layer may be disposed on the second electrode 263.

The encapsulation layer 30 may be disposed in the display area DA and the non-display area NDA of the first substrate 111, on the encapsulation layer 30. The encapsulation layer 30 may include an encapsulation film 280 and a dam structure (which may be referred to herein as a "dam").

The encapsulation film 280 prevents oxygen or water from penetrating into the organic light emitting layer 262 and the second electrode 263. To this end, the encapsulation film 280 may include at least one inorganic layer and at least one organic layer. For example, the encapsulation film 280 may include a first inorganic layer 281, an organic layer 282, and a second inorganic layer 283.

The first inorganic layer 281 may be disposed on the second electrode 263. The first inorganic layer 281 may be disposed to cover the second electrode 263. The organic layer 282 may be disposed on the first inorganic layer 281. The organic layer 282 may be provided to have a sufficient thickness, for preventing particles from penetrating into the organic light emitting layer 262 and the second electrode 263 via the first inorganic layer 281. The second inorganic layer 283 may be disposed on the organic layer 282. The second inorganic layer 283 may be disposed to cover the organic layer 282.

Each of the first and second inorganic layers 281 and 283 may be formed of silicon nitride, aluminum nitride, zirconium nitride, titanium nitride, hafnium nitride, tantalum nitride, silicon oxide, aluminum oxide, titanium oxide, and/or the like. The organic layer 282 may be formed of an organic layer such as acryl resin, epoxy resin, phenolic resin, polyamide resin, polyimide resin, or the like.

The dam may be disposed in the non-display area NDA to block the flow of the organic layer 282 configuring the encapsulation film 280. In more detail, the dam may be disposed to surround an outer portion of the display area DA and may block the flow of the organic layer 282 configuring the encapsulation film 280. Also, the dam may be disposed in the non-display area NDA and may block the flow of the organic layer 282 so as to prevent the organic layer 282 of the encapsulation film 280 from penetrating into the pad PAD exposed by a contact hole. Accordingly, the dam may prevent the organic layer 282 from being exposed at the outside of a display apparatus or from penetrating into the pad PAD.

The dam may be a dam structure that includes a first dam D1, a second dam D2, and a third dam D3.

The first dam D1 may be disposed to surround the outer portion of the display area DA and may primarily block the flow of the organic layer 282 configuring the encapsulation film 280. Also, the first dam D1 may be disposed between the display area DA and the pad area PA and may primarily block the flow of the organic layer 282 so as to prevent the organic layer 282 from penetrating into the exposed pad PAD.

The second dam D2 may be disposed in parallel with the first dam D1 to surround an outer portion of the first dam D1 and may be spaced apart from the first dam D1. That is, the first dam D1 may be disposed between the second dam D2 and the display area DA. In this case, an interval between the second dam D2 and the first dam D1 may have a very narrow interval of about 30 μm to 40 μm. The second dam D2 may secondarily block the flow of the organic layer 282 to the outer portion of the first dam D1. Therefore, the first dam D1 and the second dam D2 may more effectively prevent the organic layer 282 from being exposed at the outside of the display apparatus or from penetrating into the exposed pad PAD.

However, if the dam is provided as two as described above, a step height occurs due to the dam, and for this reason, a surface is not flat. Particularly, if metal patterns are formed within a narrow interval between the first dam D1 and the second dam D2 through a process using a photoresist pattern, metal in a region which should be removed is not normally removed and remains as a residual layer. In this case, if a residual layer of a metal pattern remains between adjacent first pad PAD1 and second pad PAD2, a current flows between the first pad PAD1 and the second pad PAD2 due to the residual metal layer, causing a short circuit defect. Therefore, in the display apparatus according to an embodiment of the present disclosure, the below-described third dam D3 may be disposed between the first dam D1 and the second dam D2, and thus, even when a residual metal layer remains, a current path is prevented from being formed between the first pad PAD1 and the second pad PAD2. The metal patterns may be, for example, metal patterns that extend from the touch electrodes TE, RE or that form the touch lines TL, RL, the pads PAD, or any other metal feature which may be formed between or adjacent to the first and second dams D1, D2, and which may form a residual metal layer between the first and second dams D1, D2 as described herein.

The third dam D3 may connect the first dam D1 to the second dam D2. The third dam D3 may partially connect the first dam D1 and the second dam D2 which are disposed in parallel and are spaced apart from each other. Therefore, the dam structure according to an embodiment of the present disclosure may have a ladder shape.

Particularly, the third dam D3 according to an embodiment of the present disclosure may be disposed in the pad area PA where a number of short circuit defects occur due to a residual metal layer. The third dam D3 may be disposed between the first dam D1 and the second dam D2 and between a first pad PAD1 and a second pad PAD2 adjacent thereto. The third dam D3 may be disposed between the first pad PAD1 and the second pad PAD2 adjacent thereto, thereby preventing a short circuit defect from occurring when a current flows between a first touch line TL1 connected to the first pad PAD1 and a second touch line TL2 connected to the second pad PAD2 due to the residual metal layer. The third dam D3 according to an embodiment of the present disclosure may be disposed between a plurality of pads PAD, and thus, the number of third dams D3 may be less than the number of the pads PAD. Also, the third dam D3 according to an embodiment of the present disclosure may be provided lower in height than the first dam D1 and the second dam D2. Accordingly, in the dam according to an embodiment of the present disclosure, even in a case where the first dam D1 is partially connected to the second dam D2 by the third dam D3 in the pad area PA, a step height occurs between the first dam D1 and the third dam D3 and between the third dam D3 and the second dam D2, and thus, the flow of the organic layer 282 is blocked so as to prevent penetration of the organic layer 282.

The dam may be formed simultaneously with the planarization layer 250 or the bank 270 of each pixel P and may be formed of the same material as that of the planarization layer 250 or the bank 270. In this case, the dam may be formed of an organic material such as acryl resin, epoxy resin, phenolic resin, polyamide resin, polyimide resin, or the like.

In FIG. 6, it is illustrated that the dam is not covered by the first inorganic layer 281, but the present embodiment is not limited thereto. The first inorganic layer 281 may be disposed to cover the dam in a case of covering the display area DA.

A touch sensing layer 40 may be provided on the encapsulation layer 30. The touch sensing layer 40 may include a buffer layer 290, a plurality of first touch electrodes TE, a plurality of second touch electrodes RE, a plurality of bridge electrodes BE, an insulation layer 310, and a passivation layer 320.

The buffer layer 290 may be disposed on the encapsulation layer 30. The buffer layer 290 may be provided in order for the pad PAD to be exposed in the display area DA and the non-display area NDA. The buffer layer 290 may be provided to cover the dam. The buffer layer 290 may be omitted.

The plurality of first touch electrodes TE and the plurality of second touch electrodes RE may be disposed on the buffer layer 290. The plurality of first touch electrodes TE may be connected to each other in a first direction (a Y-axis direction), and the plurality of second touch electrodes RE may be connected to each other in a second direction (an X-axis direction). The first direction (the Y-axis direction) may be a direction parallel to the scan lines SL1 to SLn, and the second direction (the X-axis direction) may be a direction parallel to the data lines DL1 to DLm. Alternatively, the first direction (the Y-axis direction) may be a direction parallel to the data lines DL1 to DLm, and the second direction (the X-axis direction) may be a direction parallel to the scan lines SL1 to SLn.

Each of first touch electrodes TE connected to each other in the first direction (the Y-axis direction) may be electrically insulated from first touch electrodes TE adjacent thereto in the second direction (the X-axis direction). Each of second touch electrodes RE connected to each other in the second direction (the X-axis direction) may be electrically insulated from second touch electrodes RE adjacent thereto in the first direction (the Y-axis direction).

Therefore, a mutual capacitor corresponding to a touch sensor may be provided in an intersection area of each of the first touch electrodes TE and a corresponding second touch electrode RE.

A first touch electrode TE, disposed in one side end among first touch electrodes TE connected to each other in the first direction (the Y-axis direction), may be connected to a first touch line TL in the non-display area NDA. The first touch line TL may extend from the first touch electrode TE and may be pattern-formed up to the pad area PA. The first touch line TL may be connected to the pad PAD in the pad area PA and may be connected to the first touch driver 181 through the pad PAD. Therefore, the first touch electrodes TE connected to each other in the first direction (the Y-axis direction) may receive a driving pulse from the first touch driver 181 through the first touch line TL.

A second touch electrode RE, disposed in one side end among the second touch electrodes RE connected to each other in the second direction (the X-axis direction), may be connected to a second touch line RL in the non-display area NDA. The second touch line RL may extend from the second touch electrode RE and may be pattern-formed up to the pad area PA. The second touch line RL may be connected to the pad PAD in the pad area PA and may be connected to the second touch driver 182 through the pad PAD. Therefore, the second touch driver 182 may receive charging variations of touch sensors of the second touch electrodes RE connected to each other in the second direction (the X-axis direction).

The insulation layer 310 may be disposed on the first touch electrodes TE and the second touch electrodes RE. The first touch electrodes TE, the second touch electrodes RE, the first touch lines TL, and the second touch lines RL may be disposed on the same layer. The insulation layer 310 may be disposed on the first touch electrodes TE and the second touch electrodes RE, and moreover, may be disposed between the first touch electrodes TE and the second touch electrodes RE. Each of the first touch electrodes TE may be insulated from each of the second touch electrodes RE by the insulation layer 310.

The bridge electrode BE may be disposed on the insulation layer 310. In order to prevent the first touch electrodes TE and the second touch electrodes RE from being short-circuited with one another in intersection areas therebetween, first touch electrodes TE adjacent to each other in the first direction (the Y-axis direction) may be electrically connected to each other through the bridge electrode BE. The bridge electrode BE may be disposed on a layer which differs from the first and second touch electrodes TE and RE, and may be connected to adjacent first touch electrodes TE through contact holes CT. The bridge electrode BE may intersect the second touch electrodes RE.

In this case, the contact holes CT may be formed to pass through the insulation layer 310. The bridge electrode BE may be provided on the insulation layer 310 and may be connected to two adjacent first touch electrodes TE through two through holes CT which expose the two adjacent first touch electrodes TE. Also, the bridge electrode BE may connect the two through holes CT. Therefore, the bridge electrode BE may be disposed on the insulation layer 310.

The passivation layer 320 may be disposed on the insulation layer 310 and the bridge electrode BE. The passivation layer 320 blocks a harmful environment from the outside to maintain stability of a characteristic of the display apparatus.

In an embodiment of the present disclosure, since the touch sensing layer 40 is directly provided on the encapsulation layer 30, alignment is not needed in bonding the first substrate 111 to the second substrate 112.

As described above, according to an embodiment of the present disclosure, the third dam D3 may be disposed between the first dam D1 and the second dam D2, and thus, even when a residual metal layer remains, a current path is prevented from being formed between the first pad PAD1 and the second pad PAD2, thereby preventing a short circuit defect from being caused by a current which flows due to the residual metal layer.

As described above, according to the embodiments of the present disclosure, the third dam may be disposed between the first dam and the second dam, and thus, even when a residual metal layer remains, a current path is prevented from being formed between the first pad and the second pad, thereby preventing a short circuit defect from being caused by a current which flows due to the residual metal layer.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A display apparatus, comprising:
   a first substrate including a display area, and a non-display area surrounding the display area;
   a plurality of pixels on the first substrate in the display area;
   a dam structure in the non-display area, the dam structure surrounding the display area;
   an encapsulation film on the first substrate, the encapsulation film covering the display area and contacting the dam structure;
   a touch sensing layer including a first touch electrode and a second touch electrode on the encapsulation film; and
   a metal pattern on the encapsulation film and the dam structure,
   wherein the dam structure comprises:
      a first dam;
      a second dam, the first dam being between the second dam and the display area; and
      a third dam connecting the first dam to the second dam,
   wherein the metal pattern is electrically connected to at least one of the first touch electrode or the second touch electrode.

2. The display apparatus of claim 1, wherein a height of the third dam is less than a height of the first dam.

3. The display apparatus of claim 1, wherein the dam structure has a ladder shape.

4. The display apparatus of claim 1, wherein the first dam and the second dam are disposed in parallel, spaced apart from each other, and partially connected to each other by the third dam.

5. The display apparatus of claim 1, wherein
   the encapsulation film comprises an organic layer, and
   the dam structure surrounds the organic layer.

6. The display apparatus of claim 1, wherein
   the third dam is formed of an organic material.

7. The display apparatus of claim 1, wherein
   at least one of the first touch electrode or the second touch electrode is formed in a mesh pattern.

8. The display apparatus of claim 1, further comprising:
   a plurality of pads disposed in a pad area, the pad area being positioned on one side of the non-display area,
   wherein the third dam is disposed between the plurality of pads in the pad area.

9. The display apparatus of claim 8, wherein the metal pattern contacts the plurality of pads.

10. The display apparatus of claim 8, wherein the dam structure includes a plurality of third dams, the third dams respectively disposed between adjacent ones of the pads, and a number of the plurality of third dams is less than number of the plurality of pads.

11. The display apparatus of claim 1,
    wherein the metal pattern extends from at least one of the first touch electrode or second touch electrode.

12. The display apparatus of claim 11, further comprising a bridge electrode connecting the first touch electrode to the second touch electrode, the bridge being disposed on a different layer as the first touch electrode and is spaced apart from the first touch electrode.

13. The display apparatus of claim 1, further comprising:
    a plurality of thin film transistors disposed on the first substrate; and
    a plurality of light emitting elements, each of the light emitting elements including:
       an anode disposed on and connected to a respective thin film transistor of the plurality of thin film transistors;
       a light emitting layer disposed on the anode; and
       a cathode disposed on the light emitting layer.

14. The display apparatus of claim 13, further comprising:
    a pad disposed in a pad area, the pad including a pad electrode located on a same layer as source and drain electrodes of the thin film transistors.

* * * * *